(12) United States Patent
Lin et al.

(10) Patent No.: US 9,209,298 B2
(45) Date of Patent: Dec. 8, 2015

(54) METAL-OXIDE-SEMICONDUCTOR FIELD-EFFECT TRANSISTOR WITH EXTENDED GATE DIELECTRIC LAYER

(71) Applicant: Taiwan Semiconductor Manufacturing Company, Ltd., Hsin-Chu (TW)

(72) Inventors: Shiuan-Jeng Lin, Hsin-Chu (TW); Shyh-Wei Cheng, Zhudong Township (TW); Che-Jung Chu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/790,811

(22) Filed: Mar. 8, 2013

(65) Prior Publication Data

US 2014/0252499 A1    Sep. 11, 2014

(51) Int. Cl.
*H01L 29/78* (2006.01)
*H01L 29/66* (2006.01)
*H01L 29/423* (2006.01)

(52) U.S. Cl.
CPC ...... *H01L 29/7833* (2013.01); *H01L 29/42368* (2013.01); *H01L 29/66492* (2013.01); *H01L 29/66659* (2013.01); *H01L 29/7835* (2013.01)

(58) Field of Classification Search
CPC .............. H01L 29/42368; H01L 29/7835
USPC .............. 257/356, E21.625, E21.639
See application file for complete search history.

(56) References Cited

U.S. PATENT DOCUMENTS

| | | | |
|---|---|---|---|
| 5,573,965 A * | 11/1996 | Chen et al. | 438/297 |
| 6,049,114 A * | 4/2000 | Maiti et al. | 257/412 |
| 6,515,331 B1 * | 2/2003 | Carneiro et al. | 257/336 |
| 2002/0043689 A1 | 4/2002 | Matsuoka et al. | |
| 2003/0181005 A1 | 9/2003 | Hachimine et al. | |
| 2003/0203560 A1 | 10/2003 | Ryu et al. | |
| 2004/0206980 A1 | 10/2004 | Cheong et al. | |
| 2008/0067616 A1 | 3/2008 | Ko | |
| 2010/0164021 A1 * | 7/2010 | Cho | 257/408 |
| 2011/0312165 A1 * | 12/2011 | Shimomura et al. | 438/487 |

FOREIGN PATENT DOCUMENTS

| | | | |
|---|---|---|---|
| JP | 0917883 A | | 1/1997 |
| JP | 2000196070 A | | 7/2000 |
| JP | 2003318283 A | | 11/2003 |
| JP | 2004319963 A | | 11/2004 |
| JP | 2008306195 A | | 12/2008 |
| KR | 1020080026258 | | 3/2008 |
| KR | 20100078058 | | 7/2010 |

* cited by examiner

*Primary Examiner* — Amar Movva
(74) *Attorney, Agent, or Firm* — Slater & Matsil, L.L.P.

(57) ABSTRACT

A metal-oxide-semiconductor field-effect transistor (MOSFET) includes a substrate, a source and a drain in the substrate, a gate electrode disposed over the substrate between the source and drain, and a gate dielectric layer disposed between the substrate and the gate electrode. At least a portion of the gate dielectric layer is extended beyond the gate electrode toward at least one of the source or the drain.

19 Claims, 5 Drawing Sheets

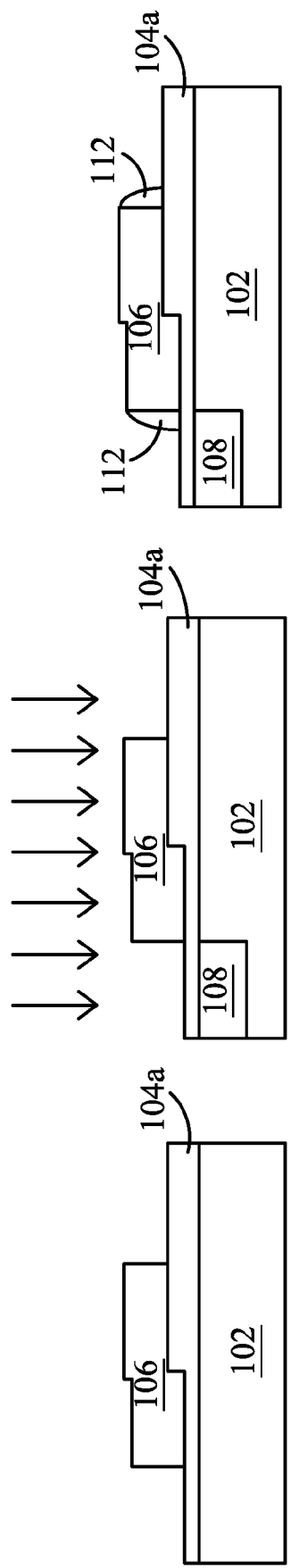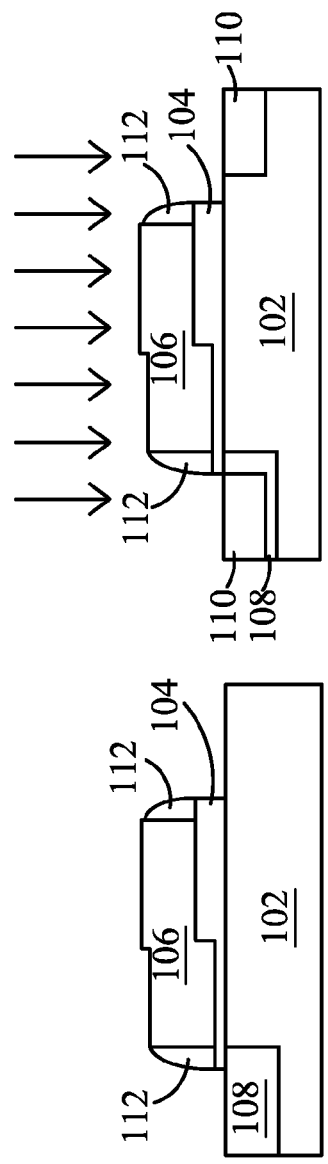
Fig. 4A
Fig. 4B
Fig. 4C
Fig. 4D
Fig. 4E

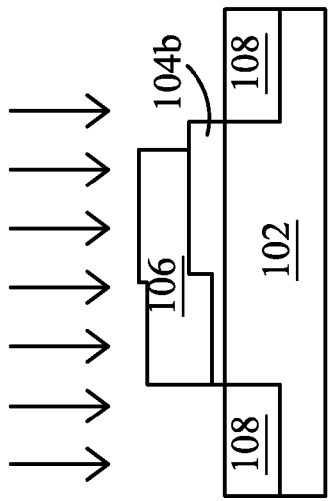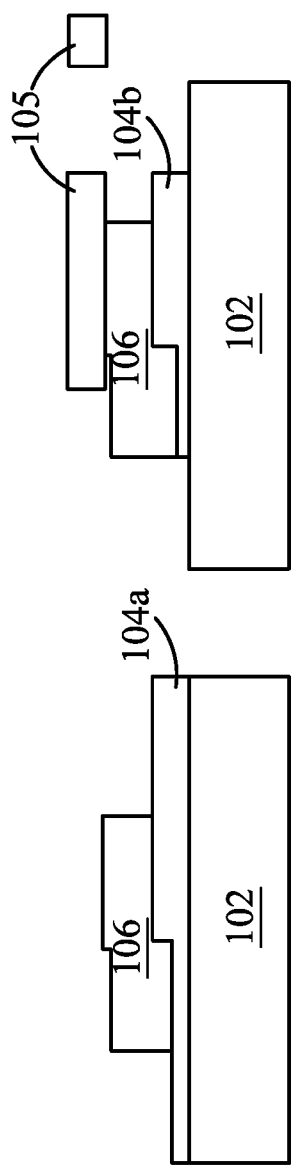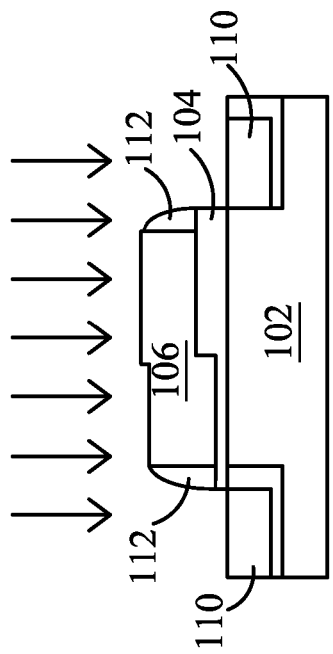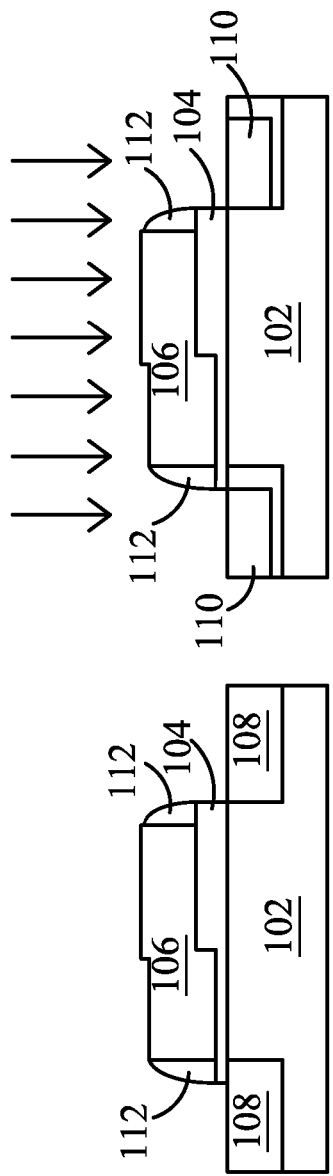

METAL-OXIDE-SEMICONDUCTOR FIELD-EFFECT TRANSISTOR WITH EXTENDED GATE DIELECTRIC LAYER

TECHNICAL FIELD

The present disclosure relates generally to an integrated circuit and more particularly a metal-oxide-semiconductor field-effect transistor (MOSFET).

BACKGROUND

Some MOSFETs are designed to sustain a high operating voltage. The gate dielectric breakdown voltage (Vbd) of some MOSFETs with a broader range of Vbd (referred to as "tailing") suffers a reliability issue. For example, a high voltage (HV) MOSFET device with a poly finger structure often suffers such a Vbd tailing. Some devices previously designed to increase the Vbd resulted in a larger device pitch, an increased threshold voltage Vt, or gate oxide thinning at the corners, which induces unstable or unwanted device performance.

BRIEF DESCRIPTION OF THE DRAWINGS

Reference is now made to the following descriptions taken in conjunction with the accompanying drawings, in which:

FIGS. 4A-4E are intermediate steps of an exemplary fabrication method of the MOSFET in FIG. 1 according to some embodiments; and FIGS. 5A-5E are intermediate steps of another exemplary fabrication method of the MOSFET in FIG. 1 according to some embodiments.

DETAILED DESCRIPTION

Figure 1:
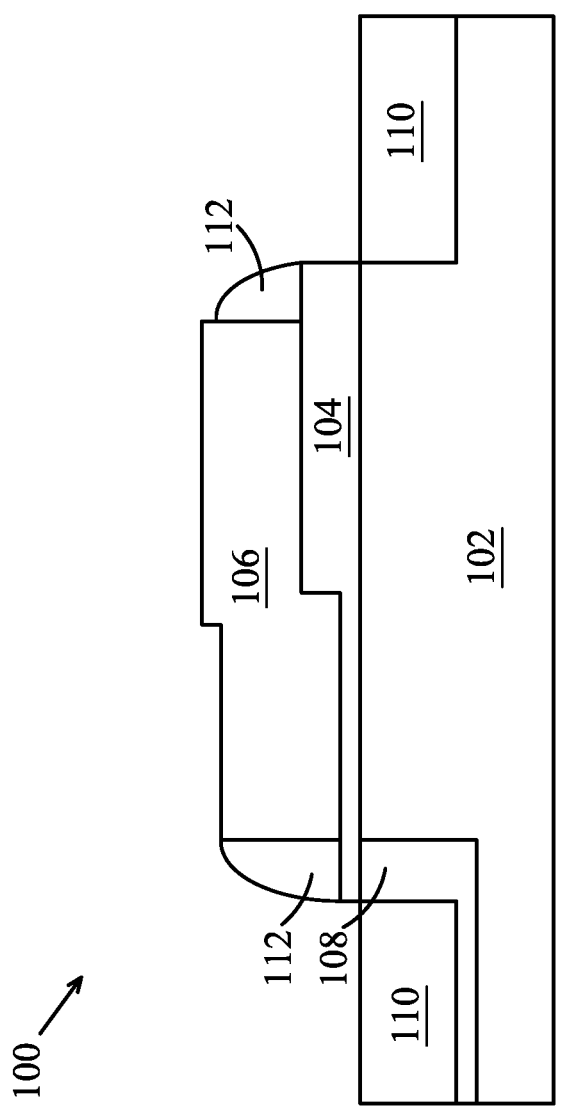
FIG. 1 is a schematic diagram of an exemplary MOSFET according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary MOSFET according to some embodiments. The MOSFET 100 includes a substrate 102, a gate dielectric layer 104, source/drain 110, lightly doped region 108, a gate electrode 106, and spacers 112.

The substrate 102 provides support and serves as the foundation upon which integrated circuit devices are fabricated. The substrate 102 comprises silicon, silicon dioxide, aluminum oxide, sapphire, germanium, gallium arsenide (GaAs), an alloy of silicon and germanium, indium phosphide (InP), silicon on isolator, or any other suitable material.

The gate dielectric layer 104 comprises silicon dioxide or any other suitable dielectric material. The gate dielectric layer 104 is thicker on the drain side compared to the source side in some embodiments for high voltage applications. In some embodiments, the thickness of the gate dielectric layer 104 is 30 Å-1000 Å.

The gate dielectric layer 104 extends beyond the gate electrode 106 toward at least one of the source or the drain 110. The extended gate dielectric layer 104 can reduce the Vbd tailing problem as described with respect to FIG. 3. In some embodiments, the gate dielectric layer 104 extends beyond the gate electrode 106 edge by at least ½ of the gate dielectric layer 104 thicknesses.

In one example, the gate dielectric layer 104 extends from the gate electrode 106 edge by a length equal to the thickness of the gate dielectric layer 104. In some embodiments, the gate dielectric layer 104 is extended by 0.03 µm-0.3 µm from the gate electrode 106 edge.

The gate electrode 106 comprises polysilicon, metal, or any other suitable material. The lightly doped region 108 adjacent to the gate electrode 106 is used to avoid short-channel effect. The lightly doped region 108 is located adjacent to the gate electrode 106 on the source/drain 110 side in the substrate 102. The lightly doped region 108 is doped with N-type or P-type dopants such as phosphorous or boron by ion implantation, for example. Even though the lightly doped region 108 is shown on one side (e.g., the source side) in FIG. 1, it can be on both the source and drain sides as shown in FIG. 2.

The spacer 112 is formed adjacent the gate electrode 106 and at least partially over the gate dielectric layer 104 when the gate dielectric layer 104 extends beyond the gate electrode 106. The spacer 112 comprises silicon nitride, silicon dioxide, or any other suitable material. The spacer 112 can be used for the definition of the source/drain 110 and functions as a mask for self-aligned formation in some embodiments. The source/drain 110 are doped with an N-type or P-type dopants such as phosphorous or boron by ion implantation, for example.

Figure 2:
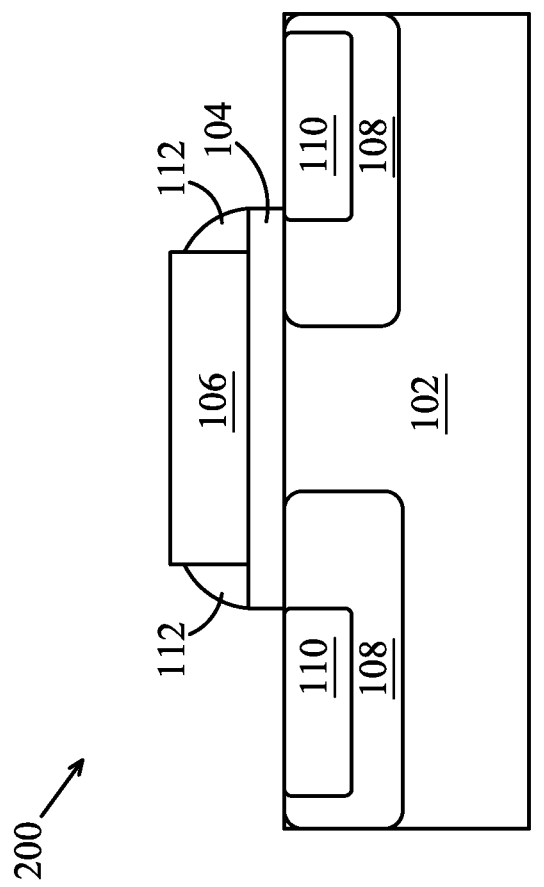
FIG. 2 is a schematic diagram of another exemplary MOSFET according to some embodiments.

FIG. 2 is a schematic diagram of another exemplary MOSFET 200 according to some embodiments. The MOSFET 200 is similar to the MOSFET 100 in FIG. 1 with the gate dielectric layer 104 extended beyond the gate electrode 106 toward the source and the drain 110. In other embodiments, the gate electrode 106 can be extended toward one of the source or the drain side. In one example, the gate electrode 106 is extended toward the drain side. The gate dielectric layer 104 has a uniform thickness compared to the MOSFET 100 in FIG. 1. The lightly doped region 108 is formed in both source and drain sides.

The extended dielectric layer 104 can be implemented in various MOSFET structures. For example, a symmetric MOSFET such as shown in FIG. 2, an asymmetric MOSFET, a laterally diffused metal oxide semiconductor (LDMOS) transistor, or any other MOSFET structures.

Some MOSFETs with the extended gate dielectric layer 104 can be used for high voltage applications with a gate voltage Vg ranging from 6.75 V to 40 V and a drain source voltage ranging from 6.75 V to 250 V.

Figure 3:
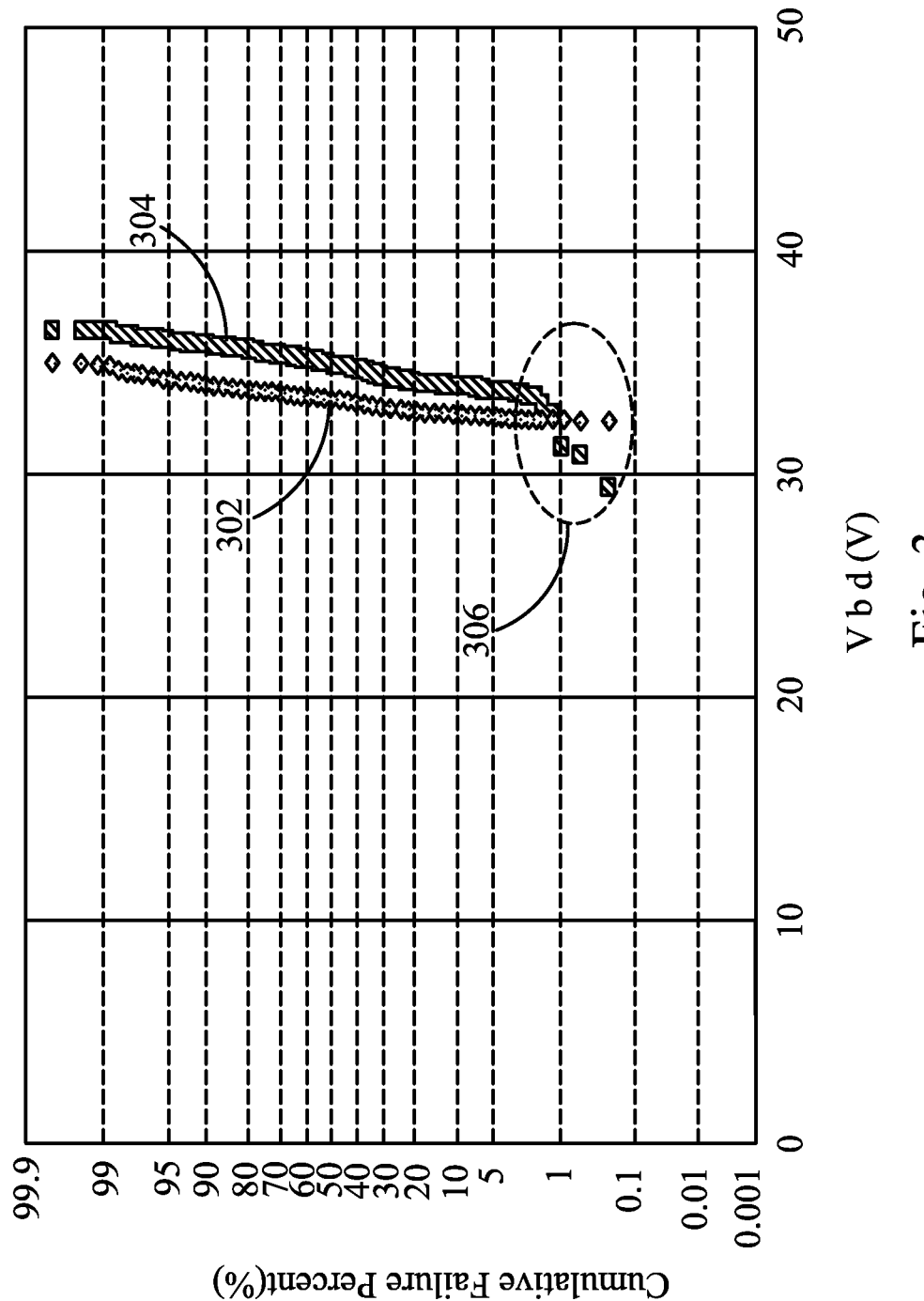
FIG. 3 is a plot of Vbd of the exemplary MOSFET in FIG. 1 compared to other MOSFETs according to some embodiments.

FIG. 3 is a plot of Vbd of the exemplary MOSFET in FIG. 1 compared to other MOSFETs according to some embodiments. A line 302 for the MOSFETs with the extended gate dielectric layer 104 as shown in FIG. 1 and FIG. 2 does not have the Vbd tailing problem (spread Vbd over a broader range of voltage values), compared to the line 304 for other MOSFETs, particularly in the area 306.

FIGS. 4A-4E are intermediate steps of an exemplary fabrication method of the MOSFET in FIG. 1 according to some embodiments.

In FIG. 4A, a gate dielectric layer 104a and a gate electrode 106 are formed over the substrate 102. The gate dielectric layer 104a comprises silicon dioxide or any other suitable material and the gate electrode 106 comprises polysilicon, metal, or any other suitable material.

In one example, a silicon dioxide (oxide) layer for the gate dielectric layer 104a is grown on the substrate 102 and a polysilicon layer for the gate electrode 106 is deposited over the silicon dioxide and patterned to form the gate electrode 106.

The gate dielectric layer 104a is thicker on the drain side compared to the source side in some embodiments, especially for some high voltage applications. For example, an oxide layer with a thickness of 320 Å (i.e., the difference of the desired source side and drain side gate dielectric thicknesses) can be grown on the wafer and the oxide layer on the source side can be etched out by using a mask. Then an additional oxide layer with a thickness of 32 Å (i.e., the desired source side thicknesses) can be grown again on the wafer to form the gate oxide layer with different thicknesses on the source side (32 Å) and the drain side (352 Å). In other embodiments, the thickness of the gate dielectric layer 104a can be uniform. In some embodiments, the thickness of the gate dielectric layer 104 is 30 Å-1000 Å.

In FIG. 4B, the lightly doped region 108 is formed by ion implantation using the gate electrode 106 as a mask in some embodiments so that the lightly doped regions 108 are self-aligned to the edges of the gate electrode 106. In some embodiments, a photomask or hard mask (not shown) is employed to protect the drain region during the ion implantation steps, so that only the source region has a lightly doped region. In other embodiments, a lightly doped region is formed in both the source side and the drain side.

In FIG. 4C, the spacer 112 is formed by chemical vapor deposition and etching, for example. The spacer 112 comprises silicon nitride, silicon dioxide, or any other suitable material.

In FIG. 4D, the gate dielectric layer 104a in FIG. 4C is etched by a (high voltage) etching process using the spacer 112 as a mask in some embodiments so that the resulting gate dielectric layer 104 is self-aligned to the edges of the spacer 112. The spacer 112 is at least partially over the extended gate dielectric layer 104.

In FIG. 4E, the source/drain 110 is formed by ion implantation using the gate electrode 106 and the spacer 112 as a mask in some embodiments so that the source/drain 110 is self-aligned to the edges of the spacer 112. The gate dielectric layer 104 is extended beyond the gate electrode 106 toward at least one of the source or the drain 110. In one example, the gate dielectric layer 104 is extended toward the drain 110. In another example, the dielectric layer 104 is extended toward both the source and the drain 110. The extended gate dielectric layer 104 can reduce the Vbd tailing problem as described in FIG. 3.

In some embodiments, the gate dielectric layer 104 is extended from the gate electrode 106 edge by at least ½ of the gate dielectric layer 104 thicknesses. In one example, the gate dielectric layer 104 is extended from the gate electrode 106 edge by a length equal to the thickness of the gate dielectric layer 104. In some embodiments, the gate dielectric layer 104 is extended by 0.03 μm-0.3 μm from the gate electrode 106 edge.

FIGS. 5A-5E are intermediate steps of another exemplary fabrication method of the exemplary MOSFET in FIG. 1 according to some embodiments.

In FIG. 5A, a gate dielectric layer 104a and a gate electrode 106 are formed over the substrate 102. The gate dielectric layer 104a comprises silicon dioxide or any other suitable material and the gate electrode 106 comprises polysilicon, metal, or any other suitable material.

In one example, a silicon dioxide (oxide) layer for the gate dielectric layer 104a is grown on the substrate 102 and a polysilicon layer for the gate electrode 106 is deposited over the silicon dioxide and patterned to form the gate electrode 106.

The gate dielectric layer 104a is thicker on the drain side compared to the source side in some embodiments, especially for some high voltage applications. For example, an oxide layer with a thickness of 320 Å (i.e., the difference of the desired source side and drain side gate dielectric thicknesses) can be grown on the wafer and the oxide layer on the source side can be etched out by using a mask. Then an additional oxide layer with a thickness of 32 Å (i.e., the desired source side thicknesses) can be grown again on the wafer to form the gate oxide layer with different thicknesses on the source side (32 Å) and the drain side (352 Å). In other embodiments, the thickness of the gate dielectric layer 104a can be uniform. In some embodiments, the thickness of the gate dielectric layer 104 is 30 Å-1000 Å.

In FIG. 5B, the gate dielectric layer 104a is etched by a (high voltage) etching process using a mask 105 to align the edge of the gate dielectric layer 104b extended beyond the gate electrode 106 by a desired length in some embodiments.

In FIG. 5C, lightly doped regions 108 are formed by ion implantation using the gate electrode 106 and the thick side of the gate dielectric layer 104b as a mask in some embodiments.

In FIG. 5D, the spacer 112 is formed by chemical vapor deposition and etching, for example. The spacer 112 comprises silicon nitride, silicon dioxide, or any other suitable material. The spacer 112 is formed at least partially over the extended gate dielectric layer 104.

In FIG. 5E, the source/drain 110 is formed by ion implantation using the gate electrode 106 and the spacer 112 as a mask in some embodiments so that the source/drain 110 is self-aligned to the edges of the spacer 112. The gate dielectric layer 104 is extended beyond the gate electrode 106 toward at least one of the source or the drain 110. In one example, the gate dielectric layer 104 is extended toward the drain 110. In another example, the dielectric layer 104 is extended toward both the source and the drain 110. The extended gate dielectric layer 104 can reduce the Vbd tailing problem as described with regard to FIG. 3.

In some embodiments, the gate dielectric layer 104 is extended from the gate electrode 106 edge by at least ½ of the gate dielectric layer 104 thicknesses. In one example, the gate dielectric layer 104 is extended from the gate electrode 106 edge by a length equal to the thickness of the gate dielectric layer 104. In some embodiments, the gate dielectric layer 104 is extended by 0.03 μm-0.3 μm from the gate electrode 106 edge.

According to some embodiments, a metal-oxide-semiconductor field-effect transistor (MOSFET) includes a substrate, a source and a drain in the substrate, a gate electrode disposed over the substrate between the source and drain, and a gate dielectric layer disposed between the substrate and the gate electrode. At least a portion of the gate dielectric layer is extended beyond the gate electrode toward at least one of the source or the drain.

According to some embodiments, a method of fabricating a metal-oxide-semiconductor field-effect transistor (MOSFET) includes forming a gate dielectric layer over a substrate. A gate electrode is formed over the gate dielectric layer. At least a portion of the gate dielectric layer is not covered by the gate electrode. A source and a drain are formed in the substrate. The gate dielectric layer is extended beyond the gate electrode toward at least one of the source or the drain.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A metal-oxide-semiconductor field-effect transistor (MOSFET), comprising:
   a substrate;
   a source in the substrate;
   a drain in the substrate;
   a gate electrode disposed over the substrate between the source and the drain and having a first sidewall and a second sidewall, the first sidewall being opposite from the second sidewall, the first sidewall being proximate to the drain, the second sidewall being proximate to the source;
   a gate dielectric layer disposed between the substrate and the gate electrode, wherein the gate dielectric layer is thicker at the first sidewall than at the second sidewall, the gate dielectric having a first portion extending from the first sidewall in a direction towards the drain, the gate dielectric having a second portion extending from the second sidewall in a direction towards the source;
   a first spacer along the first sidewall of the gate electrode and over the first portion of the gate dielectric; and
   a second spacer along the second sidewall of the gate electrode and over the second portion of the gate dielectric.

2. The MOSFET of claim 1, wherein at least one of the first portion or the second portion of the gate dielectric layer extends beyond the first sidewall or the second sidewall the gate electrode, respectively, by a length of at least 0.5 times of a thickness of the gate dielectric layer.

3. The MOSFET of claim 1, wherein at least one of the first portion or the second portion of the gate dielectric layer extends beyond the first sidewall or the second sidewall the gate electrode, respectively, by a length ranging from 0.03 μm to 0.3 μm.

4. The MOSFET of claim 1, wherein the gate dielectric layer comprises silicon dioxide.

5. The MOSFET of claim 1, wherein the gate electrode comprises polysilicon or metal.

6. The MOSFET of claim 1, further comprising a lightly doped region disposed adjacent to a plane along the second sidewall of the gate electrode in the substrate.

7. The MOSFET of claim 1, wherein the first spacer and the second spacer comprise silicon nitride or silicon dioxide.

8. The MOSFET of claim 1 further including a lightly doped region in the substrate between a plane of the second sidewall of the gate electrode and the source, but not including a lightly doped region in the substrate between a plane of the first sidewall of the gate electrode and the drain.

9. A metal-oxide-semiconductor field-effect transistor (MOSFET), comprising:
   a substrate;
   a source in the substrate;
   a drain in the substrate;
   a gate electrode disposed over the substrate between the source and the drain;
   a gate dielectric layer disposed between the substrate and the gate electrode, wherein the gate dielectric layer is thicker at an edge of the gate electrode than at an opposite edge of the gate electrode; and
   a spacer formed adjacent the gate electrode and at least partially over the gate dielectric layer;
   wherein at least a portion of the gate dielectric layer extends beyond the gate electrode toward at least one of the source or the drain, by a length of at least 0.5 times a thickness of the gate dielectric layer.

10. The MOSFET of claim 9, wherein the gate dielectric layer extends beyond the gate electrode by a length ranging from 0.03 μm to 0.3 μm.

11. The MOSFET of claim 9, wherein an edge of the lightly doped region is aligned with the plane of the second sidewall of the gate electrode, and an edge of the source is aligned with an edge of the second spacer.

12. The MOSFET of claim 11, wherein the lightly dope region is formed using ion implantation using the gate electrode as an implantation mask and the source is formed using ion implantation using the second spacer as an implantation mask.

13. The MOSFET of claim 1, wherein the gate dielectric layer is approximately ten times thicker at the first sidewall of the gate electrode than at the second sidewall of the gate electrode.

14. The MOSFET of claim 13, wherein the gate dielectric layer at the first sidewall of the gate electrode is approximately 350 Å, and the gate dielectric layer at the second sidewall of the gate electrode is approximately 32 Å.

15. A metal-oxide-semiconductor field-effect transistor (MOSFET), comprising:
   a substrate;

a source in the substrate;

a drain in the substrate;

a gate electrode disposed over the substrate between the source and the drain; and a lightly doped region in the substrate between the source and a first edge of the gate electrode proximate to the source, but not including a lightly doped region in the substrate between the drain and a second edge of the gate electrode proximate to the drain; and a gate dielectric layer disposed between the substrate and the gate electrode, wherein the gate dielectric layer is thicker at the second edge of the gate electrode than at the first edge of the gate electrode;

wherein at least a portion of the gate dielectric layer extends beyond the gate electrode toward at least one of the source or the drain.

16. The MOSFET of claim 15 further including a spacer formed on the side of the gate electrode nearest the source and overlying a portion of the gate dielectric layer, wherein the lightly doped region is aligned with the first edge of the gate electrode, and the source is aligned with the spacer.

17. The MOSFET of claim 16 wherein the lightly dope region is formed using ion implantation using the gate electrode as an implantation mask and the source is formed using ion implantation using the spacer as an implantation mask.

18. The MOSFET of claim 15 wherein the gate dielectric layer is approximately ten times thicker at the second edge of the gate electrode than at the first edge of the gate electrode.

19. The MOSFET of claim 18 wherein the gate dielectric layer at the second edge of the gate electrode is approximately 350 Å, and the gate dielectric layer at the first edge of the gate electrode is approximately 32 Å.

\* \* \* \* \*